United States Patent
Ishimi

(10) Patent No.: US 8,621,127 B2
(45) Date of Patent: Dec. 31, 2013

(54) MULTI-PROCESSOR DEVICE WITH GROUPS OF PROCESSORS AND RESPECTIVE SEPARATE EXTERNAL BUS INTERFACES

(75) Inventor: Koichi Ishimi, Tokyo (JP)

(73) Assignee: Renesas Electronics Corporation, Kawasaki-shi (JP)

(*) Notice: Subject to any disclaimer, the term of this patent is extended or adjusted under 35 U.S.C. 154(b) by 0 days.

(21) Appl. No.: 13/471,968

(22) Filed: May 15, 2012

(65) Prior Publication Data

US 2012/0226847 A1  Sep. 6, 2012

Related U.S. Application Data

(63) Continuation of application No. 11/970,732, filed on Jan. 8, 2008, now Pat. No. 8,200,878.

(30) Foreign Application Priority Data

Jan. 22, 2007  (JP) ................................. 2007-011367

(51) Int. Cl.
| | |
|---|---|
| *G06F 13/36* | (2006.01) |
| *G06F 13/40* | (2006.01) |
| *G06F 13/20* | (2006.01) |
| *G06F 15/00* | (2006.01) |
| *G06F 15/76* | (2006.01) |

(52) U.S. Cl.
USPC ........... 710/306; 710/307; 710/313; 710/315; 712/29

(58) Field of Classification Search
USPC ................. 710/306, 307, 313, 315; 712/29
See application file for complete search history.

(56) References Cited

U.S. PATENT DOCUMENTS

| 3,962,685 A | * | 6/1976 | Belle Isle ...................... 712/247 |
| 4,565,745 A | | 1/1986 | Kaminskas |

(Continued)

FOREIGN PATENT DOCUMENTS

| EP | 817083 A1 | 1/1998 |
| EP | 908825 A1 | 4/1999 |

(Continued)

OTHER PUBLICATIONS

Nakamura, Y.; Takamiya, M.; Sakurai, T., "An On-Chip Noise Canceller with High Voltage Supply Lines for Nanosecond-Range Power Supply Noise," VLSI Circuits, 2007 IEEE Symposium on , pp. 124,125, Jun. 14-16, 2007.*

(Continued)

*Primary Examiner* — Faisal M Zaman
(74) *Attorney, Agent, or Firm* — Miles & Stockbridge P.C.

(57) ABSTRACT

The present invention intends to provide a high-performance multi-processor device in which independent buses and external bus interfaces are provided for each group of processors of different architectures, if a single chip includes a plurality of multi-processor groups. A multi-processor device of the present invention comprises a plurality of processors including first and second groups of processors of different architectures such as CPUs, SIMD type super-parallel processors, and DSPs, a first bus which is a CPU bus to which the first processor group is coupled, a second bus which is an internal peripheral bus to which the second processor group is coupled, independent of the first bus, a first external bus interface to which the first bus is coupled, and a second external bus interface to which the second bus is coupled, over a single semiconductor chip.

13 Claims, 11 Drawing Sheets

(56) References Cited

U.S. PATENT DOCUMENTS

| | | | |
|---|---|---|---|
| 4,794,526 A * | 12/1988 | May et al. | 718/103 |
| 4,885,684 A * | 12/1989 | Austin et al. | 717/149 |
| 5,463,560 A | 10/1995 | Goto | |
| 5,502,649 A * | 3/1996 | Hirata | 716/113 |
| 5,715,436 A * | 2/1998 | Kawai et al. | 345/505 |
| 5,790,817 A * | 8/1998 | Asghar et al. | 710/311 |
| 5,797,027 A | 8/1998 | Kajiura | |
| 5,832,216 A | 11/1998 | Szczepanek | |
| 5,860,112 A | 1/1999 | Langendorf et al. | |
| 5,890,187 A | 3/1999 | Asghar | |
| 5,907,507 A | 5/1999 | Watanabe et al. | |
| 6,047,339 A | 4/2000 | Su et al. | |
| 6,121,687 A | 9/2000 | Miyamoto et al. | |
| 6,222,278 B1 | 4/2001 | Miyamoto et al. | |
| 6,262,702 B1 | 7/2001 | Murade | |
| 6,295,568 B1 | 9/2001 | Kelley et al. | |
| 6,355,984 B2 | 3/2002 | Miyamoto et al. | |
| 6,362,027 B1 * | 3/2002 | Yamazaki et al. | 438/149 |
| 6,389,526 B1 | 5/2002 | Keller et al. | |
| 6,449,273 B1 | 9/2002 | Jennings, III | |
| 6,467,009 B1 | 10/2002 | Winegarden et al. | |
| 6,542,953 B2 | 4/2003 | Porterfield | |
| 6,580,164 B1 | 6/2003 | Ohie | |
| 6,587,938 B1 | 7/2003 | Eilert et al. | |
| 6,633,994 B1 | 10/2003 | Hofmann et al. | |
| 6,640,275 B1 | 10/2003 | Kincaid | |
| 6,643,796 B1 | 11/2003 | Floyd et al. | |
| 6,777,801 B2 | 8/2004 | Ohie | |
| 6,789,167 B2 | 9/2004 | Naffziger | |
| 6,815,841 B1 * | 11/2004 | Brown et al. | 307/10.1 |
| 6,836,839 B2 | 12/2004 | Master et al. | |
| 6,842,850 B2 * | 1/2005 | Ganapathy et al. | 712/221 |
| 6,882,241 B2 * | 4/2005 | Abo et al. | 333/33 |
| 6,905,913 B2 | 6/2005 | Ohie | |
| 6,925,641 B1 * | 8/2005 | Elabd | 718/101 |
| 7,099,949 B1 * | 8/2006 | Vanhoof et al. | 709/230 |
| 7,107,382 B2 | 9/2006 | Clayton | |
| 7,145,681 B2 * | 12/2006 | Kato | 358/1.15 |
| 7,200,703 B2 | 4/2007 | Valmiki et al. | |
| 7,317,957 B1 | 1/2008 | Embree et al. | |
| 7,395,208 B2 | 7/2008 | Chrysanthakopoulos et al. | |
| 7,414,320 B2 | 8/2008 | Ohie | |
| 7,444,277 B2 | 10/2008 | Rich et al. | |
| 7,516,456 B2 | 4/2009 | Aguilar et al. | |
| 7,548,586 B1 | 6/2009 | Mimar | |
| 7,596,650 B1 | 9/2009 | Aditya et al. | |
| 7,698,493 B2 * | 4/2010 | Asaro | 710/315 |
| 7,793,238 B1 | 9/2010 | Rabkin et al. | |
| 7,902,864 B1 * | 3/2011 | Hutton et al. | 326/39 |
| 8,028,288 B2 * | 9/2011 | Suzuoki et al. | 718/104 |
| 8,200,878 B2 * | 6/2012 | Ishimi | 710/306 |
| 2002/0000583 A1 * | 1/2002 | Kitsukawa et al. | 257/257 |
| 2002/0190781 A1 * | 12/2002 | Daak | 327/536 |
| 2003/0024732 A1 * | 2/2003 | Ninomiya | 174/255 |
| 2003/0037224 A1 | 2/2003 | Oehler et al. | |
| 2003/0184339 A1 * | 10/2003 | Ikeda et al. | 326/47 |
| 2003/0200376 A1 | 10/2003 | Engel et al. | |
| 2004/0030873 A1 * | 2/2004 | Park et al. | 712/245 |
| 2004/0153716 A1 | 8/2004 | Baker | |
| 2004/0215705 A1 | 10/2004 | Hosomi | |
| 2004/0227582 A1 * | 11/2004 | Jain | 333/22 R |
| 2005/0071534 A1 | 3/2005 | Kwatra | |
| 2005/0175402 A1 | 8/2005 | Schurr et al. | |
| 2005/0223135 A1 | 10/2005 | Kotani | |
| 2005/0242375 A1 * | 11/2005 | Hou et al. | 257/211 |
| 2006/0112205 A1 | 5/2006 | Chang et al. | |
| 2006/0221585 A1 * | 10/2006 | Brench | 361/780 |
| 2006/0285272 A1 * | 12/2006 | Palanduz et al. | 361/306.1 |
| 2007/0063735 A1 * | 3/2007 | Mizuno et al. | 326/81 |
| 2007/0064402 A1 | 3/2007 | Schumacher | |
| 2007/0070737 A1 * | 3/2007 | Fischer | 365/200 |
| 2007/0159894 A1 * | 7/2007 | Huber et al. | 365/189.01 |
| 2007/0180334 A1 | 8/2007 | Jones et al. | |
| 2007/0182909 A1 * | 8/2007 | Kim et al. | 349/149 |
| 2007/0283337 A1 | 12/2007 | Kasahara et al. | |
| 2008/0028408 A1 * | 1/2008 | Day et al. | 718/104 |
| 2011/0022770 A1 | 1/2011 | Sullivan | |
| 2012/0173755 A1 * | 7/2012 | Margulis | 709/231 |

FOREIGN PATENT DOCUMENTS

| | | | | |
|---|---|---|---|---|
| EP | 1367492 A1 | 12/2003 | | |
| GB | 2427486 A | 12/2006 | | |
| JP | 03166524 A * | 7/1991 | | G02F 1/136 |
| JP | 3-263854 A | 11/1991 | | |
| JP | H05-166932 (A) | 7/1993 | | |
| JP | 05-243492 | 9/1993 | | |
| JP | 05283648 A * | 10/1993 | | H01L 27/108 |
| JP | 08088523 A * | 4/1996 | | H03F 3/60 |
| JP | 09-128346 | 5/1997 | | |
| JP | H10-173057 (A) | 6/1998 | | |
| JP | 10-260952 | 9/1998 | | |
| JP | 11-039279 | 2/1999 | | |
| JP | 11-126183 A | 5/1999 | | |
| JP | 11-191900 A | 7/1999 | | |
| JP | 11-223832 A | 8/1999 | | |
| JP | H11-353232 (A) | 12/1999 | | |
| JP | 2000-235543 A | 8/2000 | | |
| JP | 2000-276435 A | 10/2000 | | |
| JP | 2000-347933 | 12/2000 | | |
| JP | 2001-267488 (A) | 9/2001 | | |
| JP | 2003-296191 A | 10/2003 | | |
| JP | 2005-346582 A | 12/2005 | | |

OTHER PUBLICATIONS

Ryu, Jong-In; Dongsu Kim; Kim, Jun-Chul, "Isolation Effect between DC supply Voltage Signal Lines in Wireless LAN Module," Electromagnetic Compatibility, 2009 20th International Zurich Symposium on , pp. 385,388, Jan. 12-16, 2009.*

Liu Jizhi; Chen Xingbi, "A novel self-generated low-voltage power supply for the gate-driver of high-voltage off-line SMPS," Power Semiconductor Devices & IC's, 2009. ISPSD 2009. 21st International Symposium on , pp. 184,187, Jun. 14-18, 2009.*

Yanlin Wang; Xueshan Han; Xiaofeng Zhou; Hao Zha, "Line loadability analysis including var supply capability and load voltage characteristics," Electric Utility Deregulation and Restructuring and Power Technologies, 2008. DRPT 2008. Third International Conference on , pp. 1132,1136, Apr. 6-9, 2008.*

Toshiba, EmotionEngine, SCE/IBM/Toshiba, Cell, Feb. 9, 2005, [searched on Jan. 9, 2007] downloaded from the Internet at <http://ascii24.com/news/i/tech/article/2005/02/09/654178-000.html> (English translation included).

Hattori et al., "A Power Management Scheme Controlling 20 Power Domains for a Single-Chip Mobile Processor," Session 29.5, IEEE International Solid-State Circuits Conference, (ISSCC) 2006, Feb. 8, 2006, 11 pgs.

Flachs et al., "A Streaming Processing Unit for a CVELL Processor", Session 7.4, IEEE International Solid-State Circuits Conference (ISSCC) 2005, Feb. 7, 2005, pp. 1, 2, 134-135.

Pham et al., "The Design and Implementation of a First-Generation Cell Processor", Session 10.2, IEEE International Solid-State Circuits Conference (ISSCC) 2005, Feb. 8, 2005, pp. 184-185 & 592.

Intel Corporation, "Intel 80286 Hardware Reference," 2$^{nd}$ ed., Intel Japan KK, Dec. 10, 1987, 3 pages.

Office Action from Japanese Patent Application No. 2007-011367 (English translation).

"NN9801749: Generic Communication in a Multi-Component Computer System Model", Jan. 1, 1998, IBM, IBM Technical Disclosure Bulletin, vol. 41, Iss. 1, pp. 749-752.

"NN961265: Technique to Support Multiple L2 Cache Controller Interfaces", Dec. 1, 1996, IBM, IBM Technical Disclosure Bulletin, vol. 39, Iss. 12, pp. 65-66.

"NN9509237: Address Munging Support in a Memory Controller/PCI Host Bridge for the PowerPC 603 CPU Operating in 32-Bit Data Mode", Sep. 1, 1995, IBM, IBM Technical Disclosure Bulletin, Vo. 38, Iss. 9, pp. 237-240.

"NN9505401: 60x Bus-to-PCI Bridge", May 1, 1995, IBM, IBM Technical Disclosure Bulletin, vol. 38, Iss. 5, pp. 401-402.

(56) References Cited

OTHER PUBLICATIONS

Office Action issued Feb. 5, 2013, in Japanese Patent Application No. 2011-047212 (and translation thereof).

Notification of Reasons for Refusal dated Sep. 3, 2013, in Japanese Patent Application No. 2011-047212, with English-language translation.

* cited by examiner

MULTI-PROCESSOR DEVICE WITH GROUPS OF PROCESSORS AND RESPECTIVE SEPARATE EXTERNAL BUS INTERFACES

CROSS-REFERENCE TO RELATED APPLICATIONS

This application is a continuation of application Ser. No. 11/970,732 filed Jan. 8, 2008 now U.S. Pat. No. 8,200,878. The disclosure of Japanese Patent Application No. 2007-11367 filed on Jan. 22, 2007 including the specification, drawings and abstract is also incorporated herein by reference in its entirety.

The disclosure of Japanese Patent Application No. 2007-11367 filed on Jan. 22, 2007 including the specification, drawings and abstract is incorporated herein by reference in its entirety

BACKGROUND OF THE INVENTION

The present invention relates to optimal bus configurations and layouts of components of a multi-processor device in which a plurality of groups of processors are implemented in a single LSI.

In multi-processor devices in which multiple processors of the same architecture and multiple processors of different architectures such as CPU and DSP are implemented over a single semiconductor chip, bus configurations as below have been used. In one configuration, all multiple processors are coupled to a single this, as described in Non-Patent Document 1 mentioned below. In another configuration, to couple multiple processors using the same protocol to a bus, local buses are provided for each CPU and the local buses are coupled together with a bridge, as described in Non-Patent Document 2 mentioned below.

In the case where all multiple processors are coupled to a single bus, the processors are coupled to the same bus, whether the LSI multi-processor device is equipped with one external bus interface or multiple external bus interfaces.

In the case where multiple local buses are coupled together with a bridge, one processor is coupled to a local bus, the respective local buses are coupled to a single bus master, and a single bus is coupled to an external bus interface.

[Non-Patent Document 1]
Toshiba, EmotionEngine, SCE/IBM/Toshiba, Cell, Feb. 9, 2005, [searched on Jan. 9, 2007] Internet <http://ascii24.com/news/i/tech/article/2005/02/09/654178-0 00.html>

[Non-Patent Document 2]
Renesas, G1, February 2006, ISSCC2006 FIG. 29.5.1 "A Power Management Scheme Controlling 20 Power Domains for a Single-Chip Mobile Processor"

SUMMARY OF THE INVENTION

However, if multiple processors including different architectures are coupled to a single bus, as different-architecture processors generally differ in processing performance and speed, the following problem was posed: the operation of high-speed processors is impaired by low-speed processors and the performance of high-speed processors is deteriorated. If the multi-processor device includes CPUs and processors that are mainly for data processing, such as DSPs and SIMD type super-parallel processors, due to that DSPs and SIMD type super-parallel processors handle a large amount of data, the following problem was posed: the CPUs have to wait long before accessing the bus and the benefit of the enhanced performance of the multi-processor device is not available well.

With regard to a problem of coherency between caches, the coherency is ensured for multiple processors of the same architecture, but the cache coherency between different-architecture processors is not ensured practically and an inconsistency problem was presented.

If a multi-processor oriented OS is run, it is often enabled only for processors of the same architecture, as different-architecture processors are supplied by different developers and an OS designed for these processors is hardly made. Therefore, separate OSs must be provided for different-architecture processors. A situation where processors on which different OSs are connecting to a single bus means that the processors are coupled to a bus master IP connection which is unknown to the OSs on the same bus. A problem was posed in which enhanced performance such as scheduling of the multi-processor oriented OS is impaired.

Even when multiple local buses are coupled together with a bridge, the respective local buses are coupled to a single bus master and, therefore, a combination of a CPU and a local bus is considered as a single CPU. This posed the same problem as the above problem with the situation where different-architecture processors are connecting to the same bus.

Due to that the processors are coupled to the same bus, whether the LSI multi-processor device is equipped with one external bus interface or multiple external bus interfaces, the following problem was presented. A bus portion to which an external bus interface is coupled is blocked by a request for access to the external bus from another bus and cannot yield desired performance. A bus portion to which an external bus interface is not coupled experiences performance deterioration when access to the external bus interface from another bus occurs.

Therefore, the present invention has been made to solve the above problems and intends to provide a high-performance multi-processor device in which independent buses and external bus interfaces are provided for each group of processors of different architectures.

In one embodiment of the present invention, a multi-processor device comprises, over a single semiconductor chip, a plurality of processors including a first group of processors and a second group of processors, a first bus to which the first group of processors is coupled, a second bus to which the second group of processors is coupled, a first external bus interface to which the first bus is coupled, and a second external bus interface to which the second bus is coupled.

According to one embodiment of the present invention, when a plurality of groups of processors are implemented on a single semiconductor chip, independent buses and external bus interfaces are provided for each group of processors of different architectures . By this configuration, each group of processors can operate independently and, therefore, coordination and bus contention between processors are reduced. It is possible to realize at low cost a high-performance multi-processor system consuming low power.

DETAILED DESCRIPTION OF THE PREFERRED EMBODIMENTS

Figure 1:
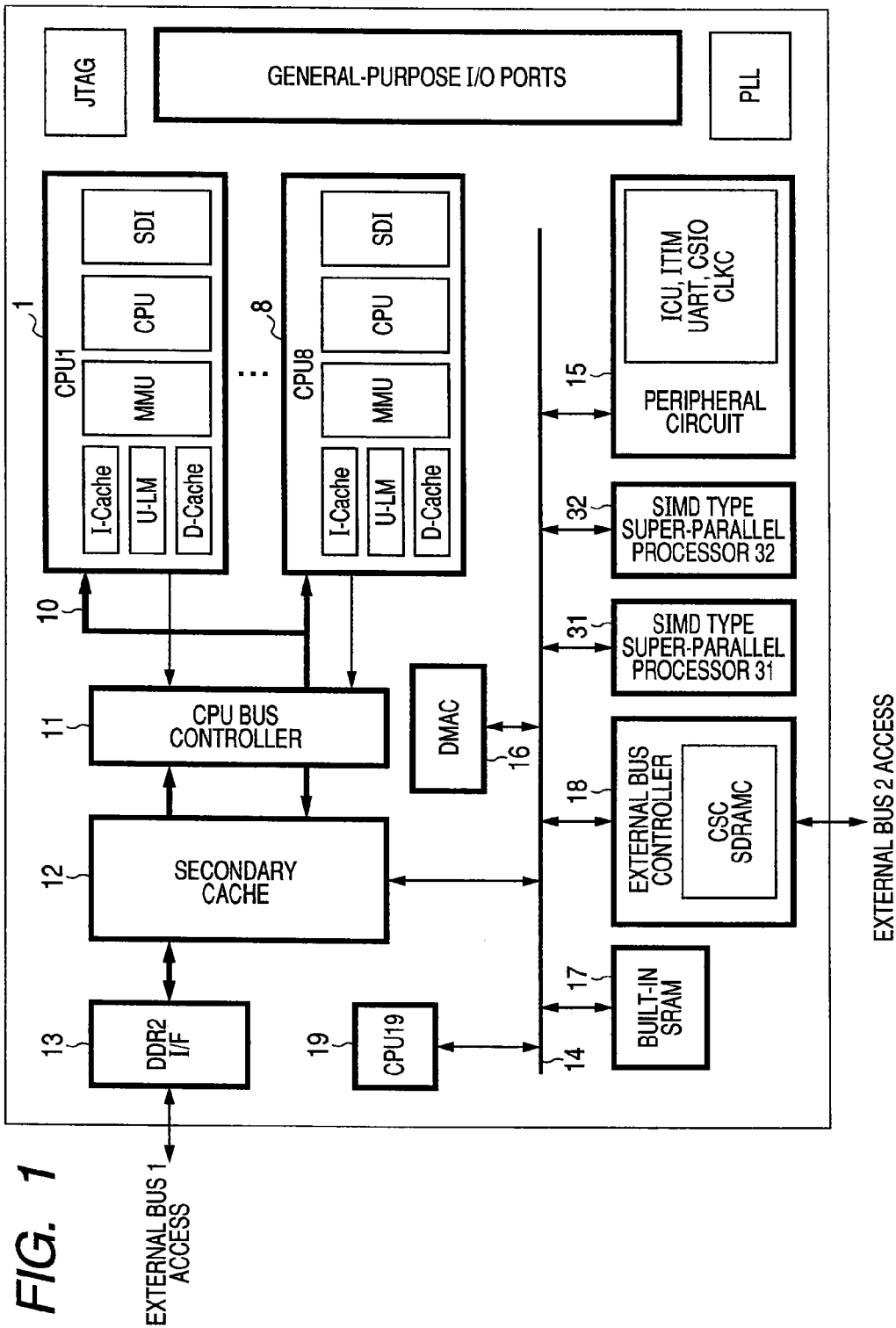
FIG. 1 is a diagram showing a configuration of a multi-processor device of Embodiment 1 of the present invention.

[Embodiment 1] FIG. 1 is a diagram showing a configuration of a multi-processor device of Embodiment 1 of the present invention. This multi-processor device is formed over a single semiconductor chip 1. Multiple processors, namely, CPUs CPU1 through CPU8 are arranged in parallel (a first group of processors), making a Symmetric Multiple Processor (SMP) structure. Each CPU includes primary caches (I-cache, D-cache), a local memory (U-LM), a memory management unit (MMU), and a debugger (SDI). Eight CPUs are coupled to a CPU bus 10 (a first bus) and the CPU bus 10 is coupled to a secondary cache 12 via a CPU bus controller 11. The secondary cache 12 is coupled to an external bus 1 via a DDR2 I/F 13 (a first external bus interface).

The CPUs operate internally at 533 MHz at maximum. The operating frequency of each CPU is converted by a bus interface inside the CPU, so that the CPU is coupled to the CPU bus 10 at 266 MHz at maximum. The secondary cache 12 and the DDR2 I/F 13 operate at 266 MHz at maximum.

The LSI device of the present invention has an internal peripheral bus 14 (a second bus) in addition to the CPU bus 10 on the same semiconductor chip. To the internal peripheral bus 14, a peripheral circuit 15 including ICU (interrupt controller), ITIM (interval timer), UART (Universal Asynchronous Receiver Transmitter: clock asynchronous serial I/O), CSIO (clock synchronous serial I/O), CLKC (clock controller), etc., a DMAC 16 (DMA controller), a built-in SRAM 17, SMP-structure matrix type super-parallel processors (SIMD type super-parallel processors 31, 32, a second group of processors), an external bus controller 18 (a second external bus interface), and a CPU 19 of another architecture are coupled. The internal peripheral bus 14 is coupled to an external bus 2 via the external bus controller 18, thereby forming an external bus access path for connection to external devices such as SDRAM, ROM, RAM, and IO.

The internal peripheral bus 14 operates at 133 MHz at maximum and the DMAC 16, built-in SRAM 17, and peripheral circuit 15 also operate at 133 MHz at maximum. The SIMD type super-parallel processors operate internally at 266 MHz at maximum. The operating frequency of each super-parallel processor is converted by a bus interface inside it to couple the processor to the internal peripheral bus 14. Likewise, the CPU 19 operates internally at 266 MHz at maximum and this operating frequency is converted by a bus interface inside it to couple it to the internal peripheral bus 14. Because there is a difference in processing performance and speed between the processor clusters, as described above, these processor clusters are controlled using separate clocks and differ in frequency and phase.

The CPU bus 10 and the internal peripheral bus 14 are coupled through the secondary cache 12. Therefore, the CPUs CPU1 through CPU8 not only can get access to the external bus 1 through the secondary cache 12 and via the DDR2 I/F 13, but also can access resources on the internal peripheral bus 14 through the secondary cache 12. Thus, the CPUs CPU1 through CPU8 can get access to another external bus 2 via the external bus controller 18, though this path is long and the frequency of the internal peripheral bus is lower thus resulting in lower performance of data transfer. The modules that are coupled to the internal peripheral bus 14 can get access to the external bus 2 via the external bus controller 18, but cannot get access to the external bus 1.

The CPUs CPU1 through CPU8 are of the same architecture. For coherency between primary and secondary caches, the contents of the primary and secondary caches are coherency controlled so as to be consistent and there is no need to worry about malfunction of the CPUs. Even in a case where a multi-processor oriented OS is used, high performance can be delivered, because eight CPUs of the same architecture and the secondary cache 12 are only connecting to the CPU bus 10 and the external bus 1 is accessible from only the CPUs CPU1 through CPU8. Especially, the SIMD type super-parallel processors operate at lower speed than the CPUs and handle a large amount of data when they process data. Consequently, these processors are liable to occupy the bus for a long time. However, this does not affect the data transfer on the CPU bus 10, because the SIMD type super-parallel processors have access to the external bus 2 through the internal peripheral bus 14.

From the viewpoint of the SIMD type super-parallel processors, the CPUs primarily use the path of the external bus 1 from the CPU bus 10. Therefore, there is no need to release the internal peripheral bus 14 for the CPUs during data transfer and efficient data transfer can be performed. This effect is significant especially because of the multi-processor consisting of a plurality of CPUs. In this embodiment example of the invention, there are eight CPUs in the multi-processor device. However, in a case where 16, 32, or more processors share the same bus with the SIMD type super-parallel processors oriented to data processing, data processing latency occurs. If the present invention is applied to such a case, its effect will be more significant.

The CPU 19 is a small microprocessor whose operating speed and processing performance are lower than the CPUs CPU1 through CPU8, but it consumes smaller power and occupies a smaller area. This CPU can perform operations such as activating the peripheral circuit 15 and checking a timer, which do not require arithmetic processing performance such as power management using CLKC. Therefore, even if the CPU 19 shares the same bus with the SIMD type super-parallel processors, it does not pose a problem in which the performance of the SIMD type super-parallel processors is deteriorated.

Figure 2:
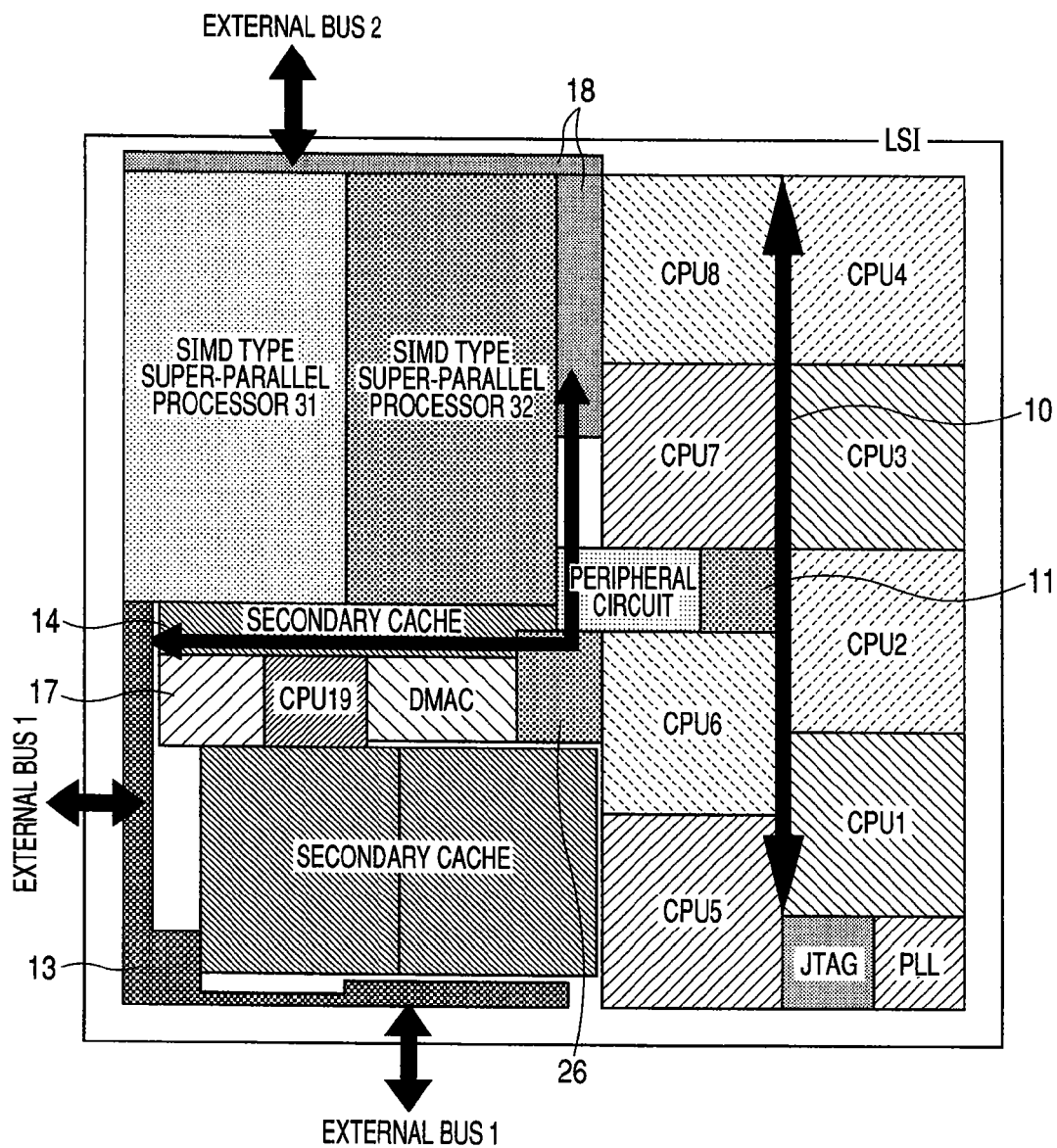
FIG. 2 is a layout view of components of the multi-processor device in Embodiment 2 of the invention.
Figure 3:
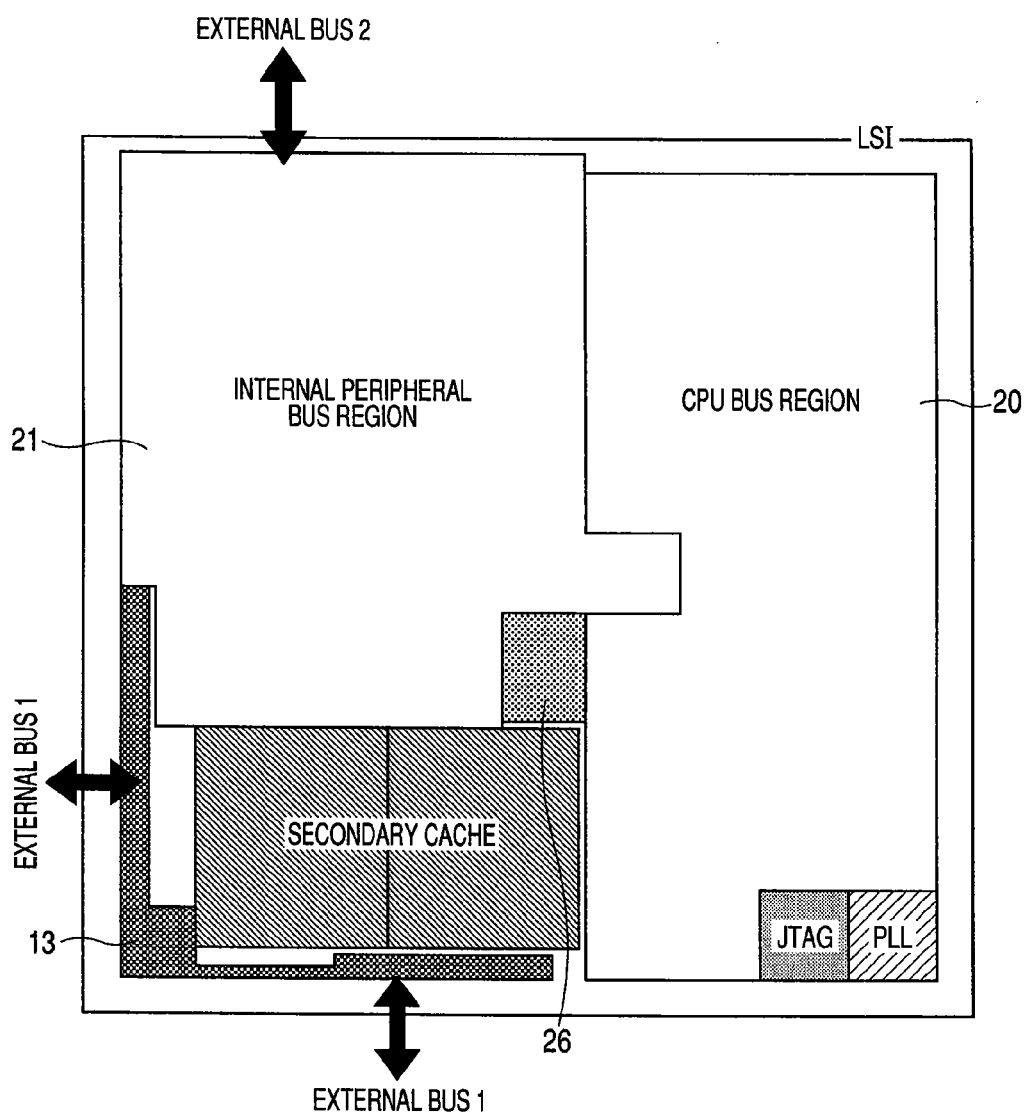
FIG. 3 is another layout view of the components of the multi-processor device in Embodiment 2 of the invention.
Figure 4:
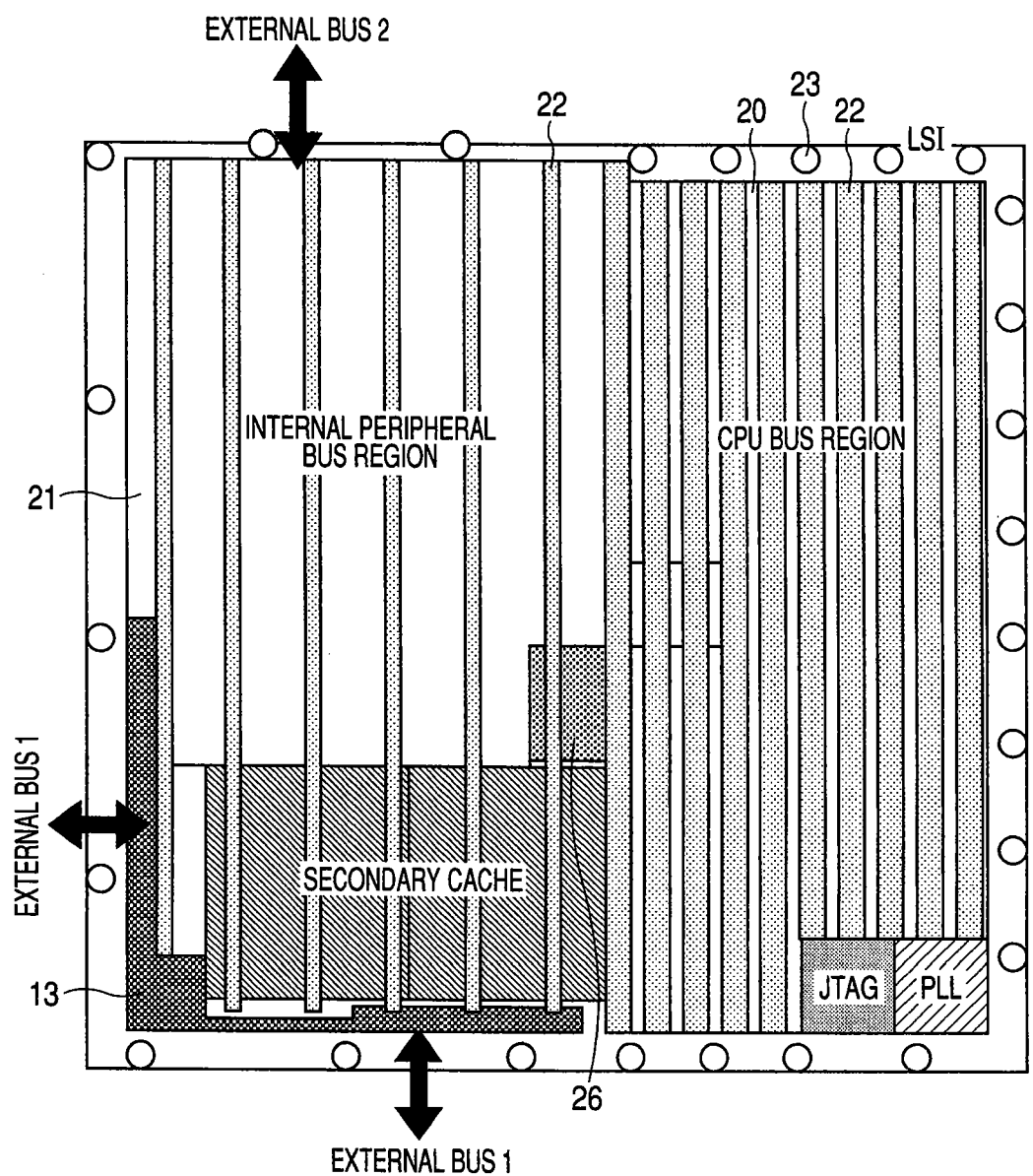
FIG. 4 is yet another layout view of the components of the multi-processor device in Embodiment 2 of the invention.

[Embodiment 2] FIGS. 2 through 4 are layout views of components of the multi-processor device in Embodiment 2 of the present invention. FIG. 2 illustrates an example of layout in which the modules constituting the multi-processor device of Embodiment 1 are actually arranged over a silicon wafer. FIG. 3 presents the layout example of FIG. 2 in another view in which the modules associated to the CPU bus (CPUs CPU1 through CPU 8 and CPU bus controller) are represented collectively as a CPU bus region 20 and the modules associated to the internal peripheral bus (SIMD type super-parallel processors 31, 32, CPU 19, built-in SRAM 17, peripheral circuit 15, external bus controller 18, and DMAC 16) are represented collectively as an internal peripheral bus region 21. FIG. 4 is a layout view in which supply voltage/GND lines 2-2 are wired.

By laying out the components of the multi-processor device as illustrated in FIG. 2, the internal peripheral bus 14 and the CPU bus 10 can be run across shortest distances as shown. This layout enables high-speed operation with less possibility of congestion due to complicated cross wiring and hence consumes smaller die area and is less costly. In the wiring, the number of crossing signal lines other than the buses decreases and speed down due to wiring congestion and long distance wiring is not likely to occur. Hence, an LSI device with low power consumption can be realized at low cost. The device area is divided into the bus regions that are easy to control for power shutdown and the like.

There is a difference in operating frequency and arithmetic processing capability between the internal peripheral bus region 21 and the CPU bus region 20 and, consequently, these regions have different power consumptions. Low-impedance wiring is required in the CPU bus region 20 with higher clock frequency and larger power consumption. Relatively high impedance is allowable in the internal peripheral bus region 21 with lower clock frequency and smaller power consumption. Low-impedance wiring in the region with larger power consumption can be implemented by wiring of wide lines or closely spaced wiring. As adverse effect of this, wired voltage supply/GND lines 22 occupy more area in the wiring layer and wiring of other signal lines and the like is hard to do. As a result, the LSI device area increases and cost increases, and additional roundabout wiring of signal lines increases wiring capacity, which in turn increases power consumption. If these regions are scattering and mixed, low-impedance wiring has to be performed throughout the device area to ensure stable operation. However, this makes the device area larger and the cost higher.

In the layout where the device area is divided into the CPU bus region 20 with larger power consumption and the internal peripheral bus region 21 with smaller power consumption, as shown in FIG. 3, it is solely required to apply low-impedance wiring of voltage supply/GND lines 22 only in the CPU bus region 20. For example, wiring can be performed such that wide lines are closely spaced in the CPU bus region 20 and narrow lines are sparsely spaced in the internal peripheral bus region 21, as shown in FIG. 4. By doing in this way, unnecessary wiring of voltage supply lines is avoided and stable operation can be assured at low cost. Similarly, voltage supply terminals can be allocated such that voltage supply/GND terminals 23 in the CPU bus region 20 are closely spaced and voltage supply/GND terminals 23 in the internal peripheral bus region 21 are sparsely spaced.

In FIG. 4, lines with widths drawn over each region are voltage supply or GND lines and circles at outer edges of the chip are voltage supply or GND terminals. Although a number of simulative, somewhat wide lines are drawn, a great number of extra-fine lines are wired actually. For example, in a manufacturing process for wiring of signal lines with a minimum width of 0.2 μm, 1 μm wide lines are wired at pitches of 4 μm in the CPU bus region 20 and 0.4 μm wide lines are wired at pitches of 100 μm in the internal peripheral bus region 21. This way of wiring enables assuring stable operation, while avoiding unnecessary wiring of voltage supply/GND lines 23. Since no external bus is coupled to the CPU bus region 20 from FIG. 1, even this region is provided with not so large number of terminals. Application of the layout of the present embodiment can realize the multi-processor device in which adverse effects are reduced to an insignificant level.

In the present embodiment, the external bus 1 and the external bus 2 are disposed apart from each other at the top and bottom edges of the chip. Because the external bus controller 18 or the DDR2 I/F 13 has high driving capability, they consume large power and are prone to produce power-supply noise or the like. However, in the layout of the present embodiment, the external bus controller 18, DDR2 I/F 13, and CPUs which carry large current are disposed apart from each other. Local concentration of power does not take place and therefore heat generation is uniform throughout the chip. The external bus controller 18, DDR2 I/F, and CPUs are sensitive to noise and temperature change. However, as they are placed apart from each other, influence of noise and heat generation on each other is reduced.

By thus disposing the modules with larger power consumption, which are sensitive to noise, apart from each other, mutual noise interference is reduced. Hence, the multi-processor device can be designed with an estimate of a smaller margin for noise. Since power consumption is uniform throughout the device and there is no local power concentration, wiring of voltage supply lines can be simplified. Besides, there is no local heat generation and the device can be designed with an estimate of a smaller margin for temperature change. Therefore, it is possible to realize at low cost the LSI device occupying a small area and consuming low power, while assuring stable operation.

Figure 5:
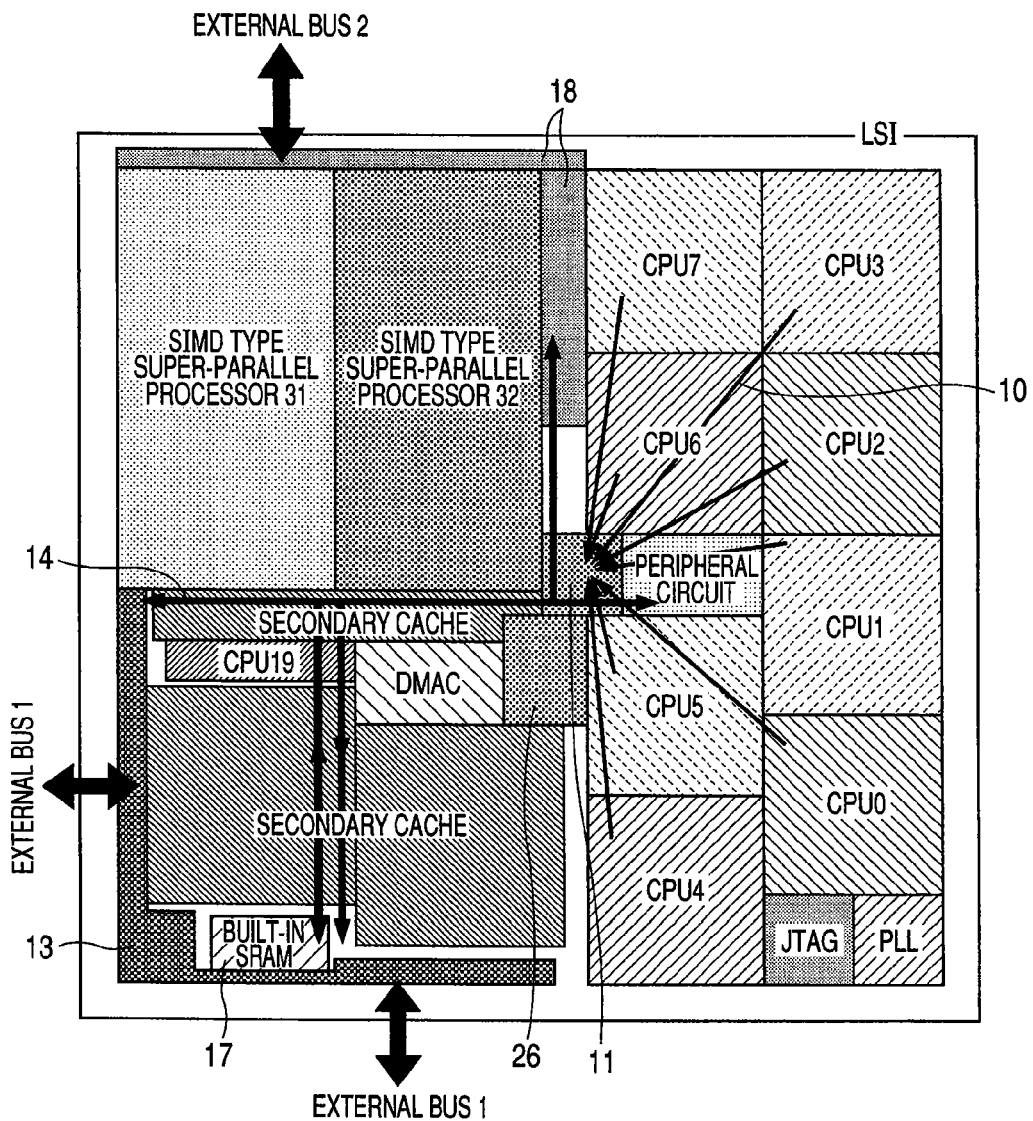
FIG. 5 is a layout view of the components of the multi-processor device in Embodiment 3 of the invention.

[Embodiment 3] FIG. 5 is an example of layout of the modules of the multi-processor device of Embodiment 1 configured on an actual silicon wafer. In comparison with Embodiment 2, changes are the positional relationship between the CPU bus controller module and the peripheral circuit module, the position and size of the built-in SRAM 17, and the shapes of the CPU 19 and the secondary caches 12.

As regards the positional relationship between the CPU bus controller module, in most cases of layout using an automatic wiring tool, buses are wired between each CPU and the CPU bus controller module as shown in FIG. 5, not a straight bus wiring that divides the CPU region into exactly two parts as shown in FIG. 2. In such cases, although some of the CPU buses slightly overlap with the internal peripheral bus 14, almost the same effect as in Embodiment 2 can be obtained. It may be preferred to place the CPU bus controller module in the vicinity of the centroid of the area compassing the CPUs and the secondary caches 12 as shown in FIG. 5. For example, the built-in SRAM 17 may be smaller than that provided in Embodiment 2 and, if the SRAM is infrequently accessed and its high operating speed is not required, its position may be changed flexibly as shown in FIG. 5. This can make the overall device area smaller and the cost lower.

In bus wiring to the built-in SRAM 17, a buffer circuit 24 is placed at a branch point from the internal peripheral bus 14. Doing so can prevent a decrease in the speed of the internal peripheral bus 14 and an increase in its power consumption due to extended wiring of the internal peripheral bus 14. Insertion of the buffer circuit 24 poses no problem, because high-speed access to the built-in SRAM 17 is not required.0

Figure 6:
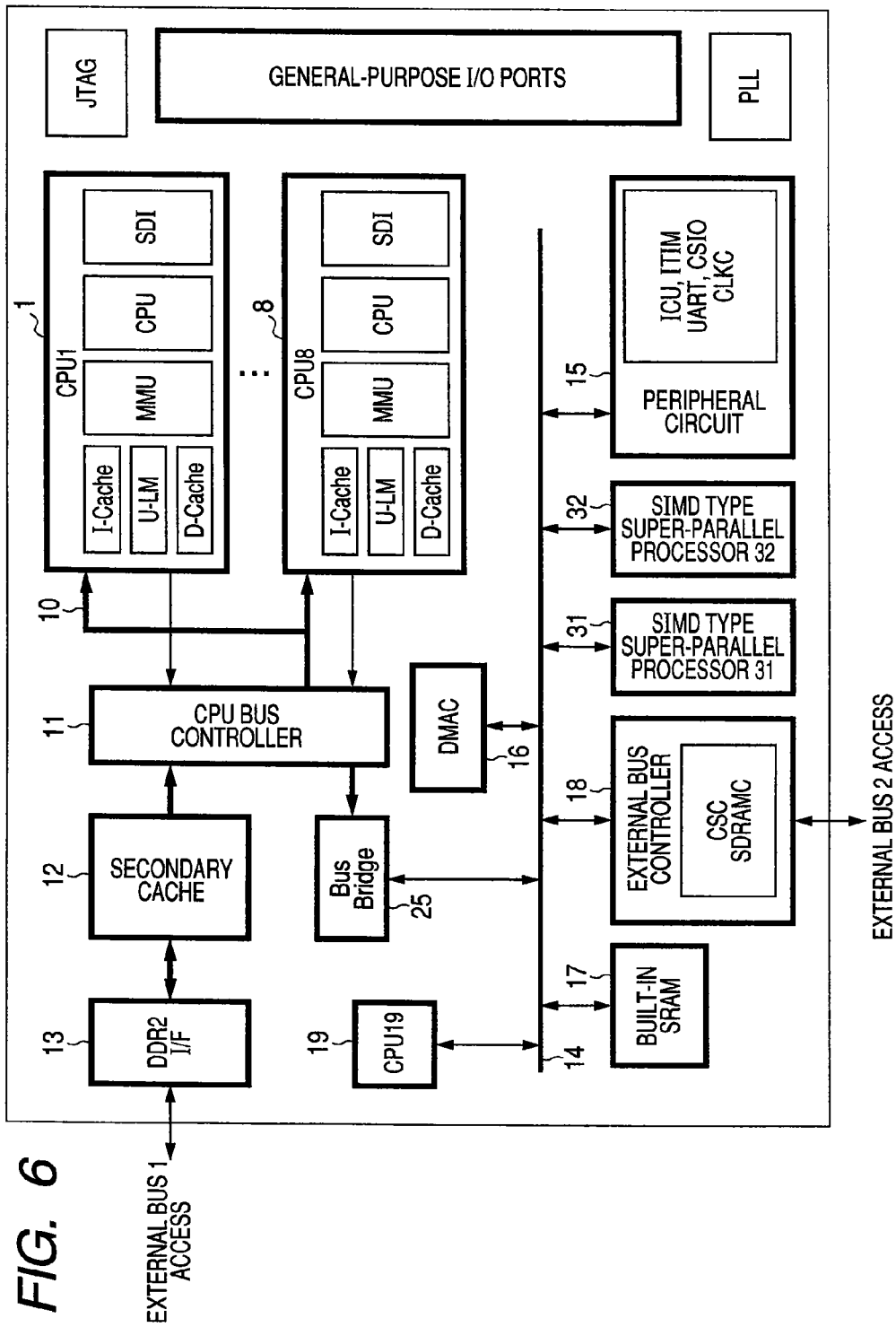
FIG. 6 is a diagram showing a configuration of a multi-processor device of Embodiment 4 of the invention.

[Embodiment 4] FIG. 6 is a diagram showing a configuration of a multi-processor device of Embodiment 4 of the present invention. Differences from Embodiment 1 are described below. The CPU bus 10 and the internal peripheral bus 14 are coupled through a bus bridge 25 circuit. Therefore, the CPUs CPU1 through CPU8 not only can get access to the external bus 1 through the secondary cache 12 and via the DDR2 I/F 13, but also can access resources on the internal peripheral bus 14 through the bus bridge 25. Thus, the CPUs CPU1 through CPU8 can get access to another external bus 2 via the external bus controller 18, though this path is long and the frequency of the internal peripheral bus is lower, thus resulting in lower performance of data transfer. The modules which are coupled to the internal peripheral bus 14 can get access to the external bus 2 via the external bus controller 18, but cannot get access to the external bus 1. However, data obtained by access to the external bus 2 and the internal peripheral bus 14 through the bus bridge 25 is excluded from caching in the secondary cache 12. The modules that are coupled to the internal peripheral bus 14 also can get access to the external bus 2 via the external bus controller 18 and to the external bus 1 as well through the bus bridge.

The CPUs CPU1 through CPU8 are of the same architecture. For coherency between the primary and secondary caches, the contents of the primary and secondary caches are coherency controlled so as to be consistent and there is no need to worry about malfunction of the CPUs. Even in a case where a multi-processor oriented OS is used, high performance can be delivered, because eight CPUs of the same architecture, the secondary cache 12, and the bus bridge 25 are only connecting to the CPU bus 10 and the external bus 1 is mostly accessed from the CPUs CPU1 through CPU8, but infrequently accessed from the modules coupled to the internal peripheral bus 14.

Other configuration details and effects are the same as for Embodiment 1 and, therefore, description thereof is not repeated.

Figure 7:
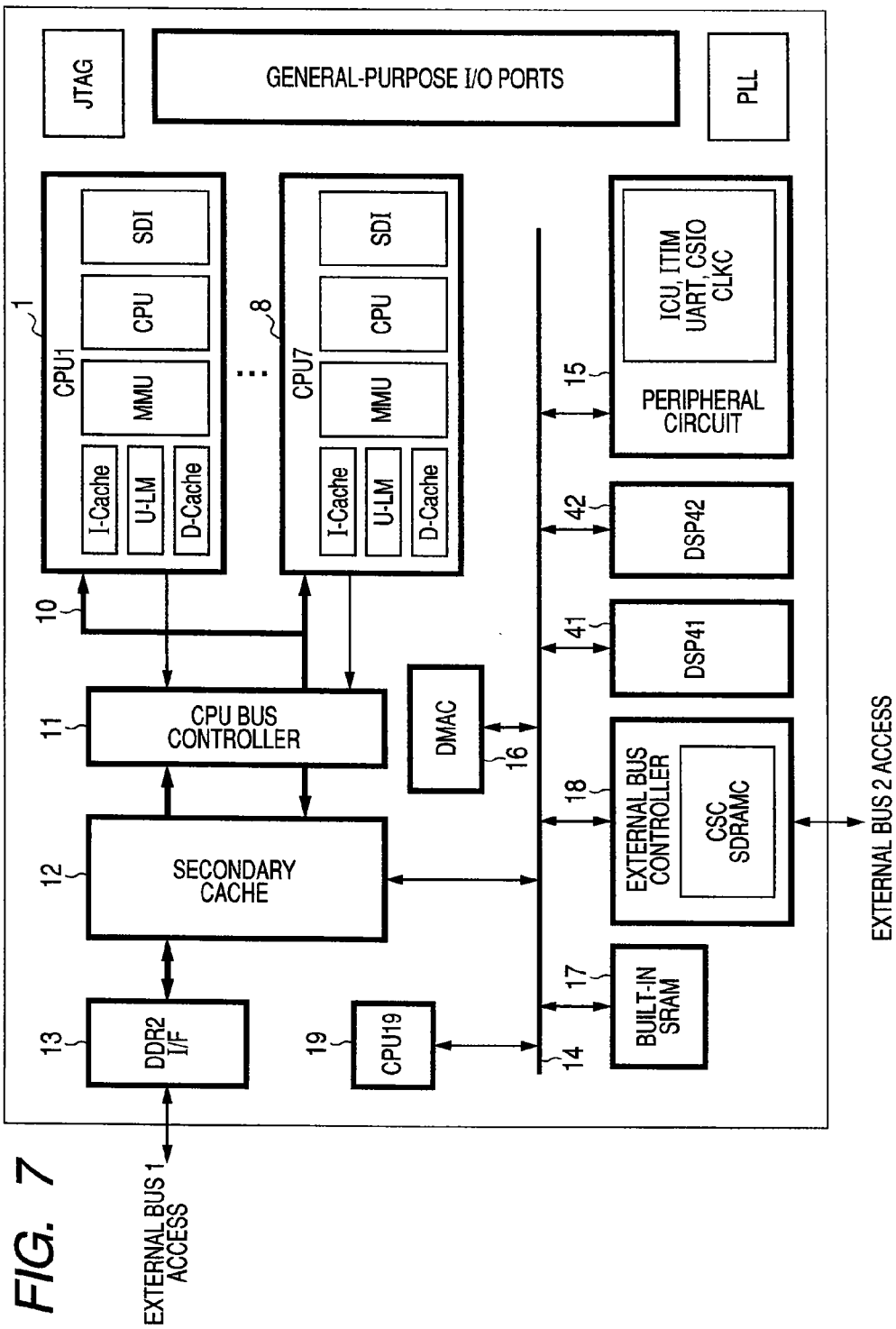
FIG. 7 is a diagram showing a configuration of a multi-processor device of Embodiment 5 of the invention.

[Embodiment 5] FIG. 7 is a diagram showing a configuration of a multi-processor device of Embodiment 5 of the present invention. Difference from Embodiment 1 lies in that, instead of the SIMD type super-parallel processors 31, 32, DSPs 41, 42 are coupled to the internal peripheral bus. Although, in this embodiment, the secondary cache 12 acts as a bridge between the CPU bus 10 and the internal peripheral bus 14, a dedicated bus bridge 25 may be used as in Embodiment 4. Other configuration details and effects are the same as for Embodiment 1 and, therefore, description thereof is not repeated.

Figure 8:
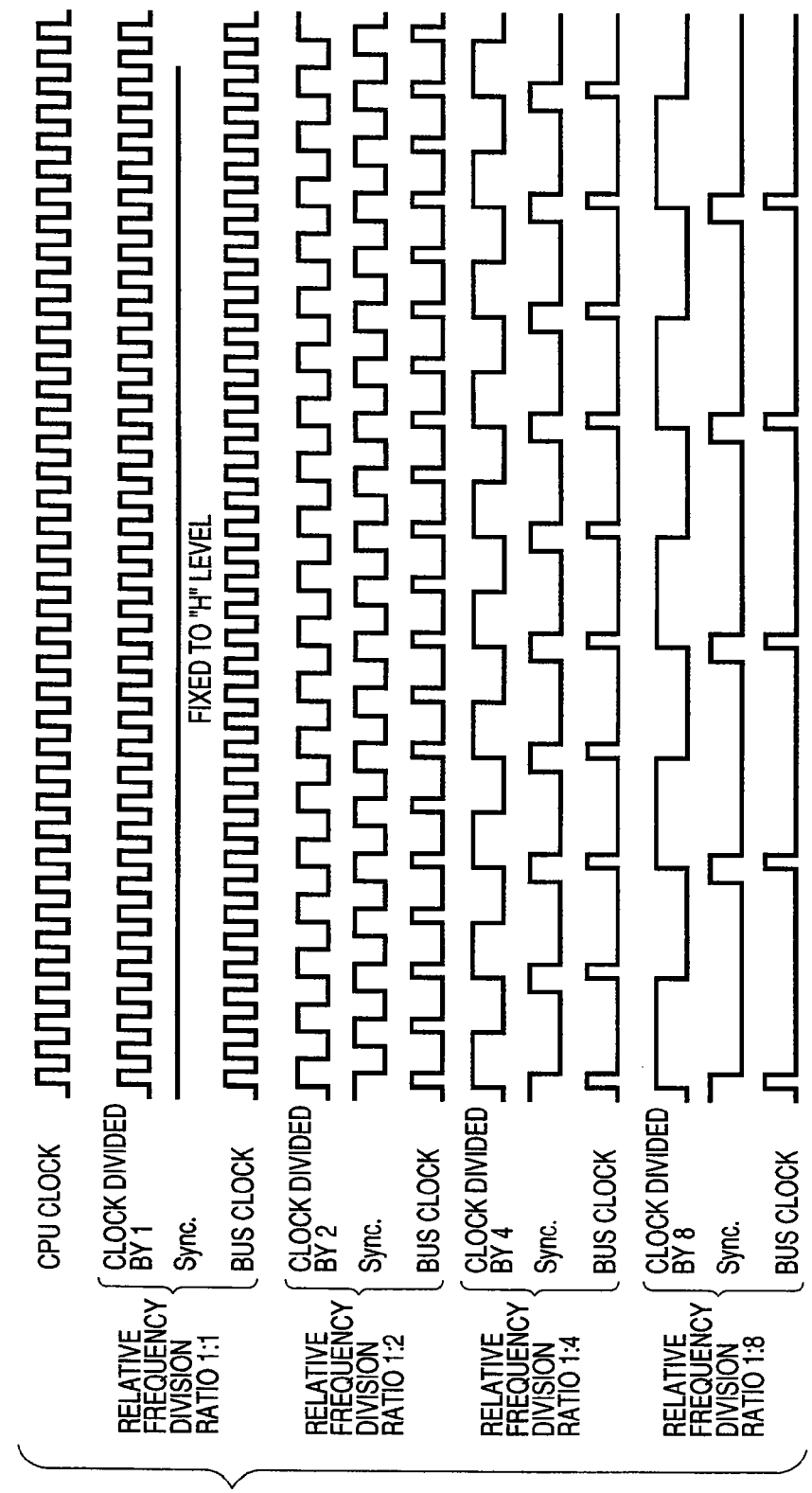
FIG. 8 is a timing chart in Embodiment 6 of the invention.

[Embodiment 6] FIG. 8 is a timing chart representing relationship between the clock of the CPUs (CPU clock) in Embodiments 1 through 5 and the CPU bus clock (bus clock). Cases where the frequency of the CPU clock is higher than the frequency of the CPU bus clock are considered. In FIG. 8, the cases where CPU clock frequency and bus clock frequency are at ratios of 1:1, 2:1, 4:1, 8:1 are shown as examples. Clocks divided by n (n=1, 2, 4, 8) are clocks obtained by dividing the frequency of the CPU clock according to the above ratios.

Figure 9:
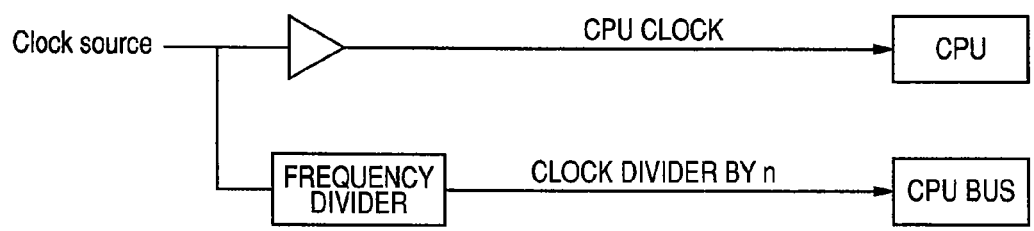
FIG. 9 is a diagram showing a clock supply circuit of prior art.
Figure 10:
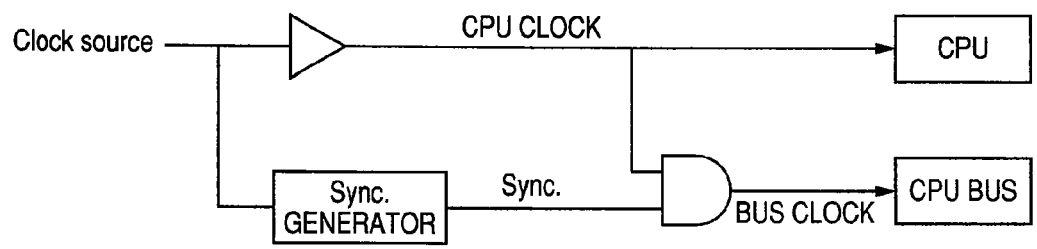
FIG. 10 is a diagram showing a clock supply circuit in Embodiment 6 of the invention.

In the present invention, a bus clock which is presented in FIG. 8 is used as the clock of the CPU bus 10 (see FIG. 1), instead of a clock divided by n. A clock supply circuit, when a clock divided by n is used, is shown in FIG. 9. A clock supply circuit, when Sync. and a bus clock are used, is shown in FIG. 10. Both a frequency divider in FIG. 9 and a sync. generator in FIG. 10 produce outputs from CLKC input thereto. Usually, there is only a single CLKC in LSI and, hence, a clock divided by n or Sync. may be transmitted on a long path to some CPUs and actually a buffer or the like may be inserted.

When a clock divided by n and Sync. are compared, the number of times of switching (switching frequency) is the same for both, but the phase of a clock divided by n must be exactly aligned with the phase of the CPU clock, whereas this is not required for Sync. Therefore, using Sync. eliminates a need for an unnecessarily large buffer and a buffer for generating a delay which introduces inefficiency, thus making it possible to realize at low cost the LSI device occupying a small area and consuming low power.

As regards the quality of the clock of the CPU bus 10, in the case of FIG. 9 where a clock divided by n is generated, a branch point from the CPU clock is far and the frequency divider is inserted. In the case of FIG. 10 where a bus clock is generated, a branch point from the CPU clock is near and only an AND circuit is inserted. Therefore, in the latter case, a phase difference (skew) with regard to the CPU clock can be smaller and operation at a higher frequency is enabled. To facilitate transfer between each CPU and the CPU bus 10, no or fewer buffers for ensuring a hold are needed. Thus, it is possible to realize at low cost the LSI device occupying a small area and consuming low power.

While the relationship between the CPU clock and CPU bus clock was explained in the present embodiment, the same is true for the relationship between the clock of the SIMD type super-parallel processors and the clock of the internal peripheral bus 14 as well as the relationship between the clock of the CPU 19 and the clock of the internal peripheral bus 14.

Figure 11:
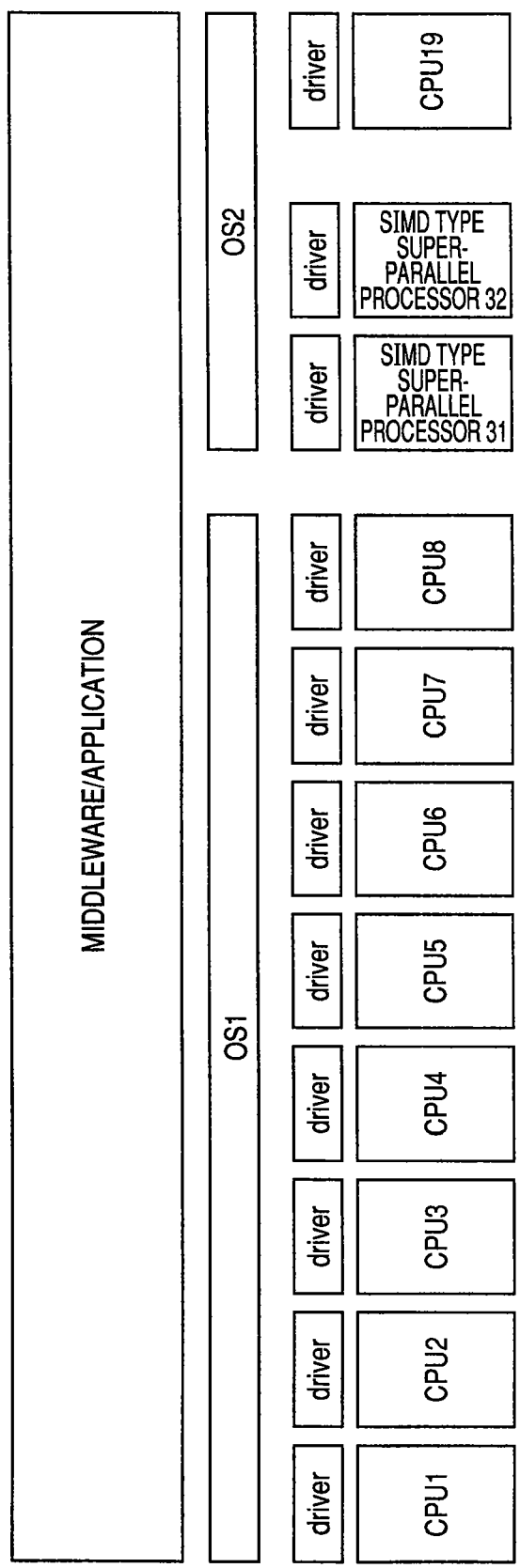
FIG. 11 is a block diagram of software in Embodiment 7 of the invention.

[Embodiment 7] FIG. 11 is a block diagram of software for a system using the multi-processor device according to any of Embodiments 1 through 6. The software structure includes device drivers (drivers) for each processor and OSs at a layer on top of the driver layer. OS1 is responsible for control of the CPUs CPU1 through CPU8 and OS2 for control of the SIMD type super-parallel processors 31, 32 and the CPU 19. It is conceivable that one OS, for example, OS1 is non-realtime OS such as Linux and the other OS2 is realtime OS such as ITRON. OS1 is optimized for CPU architecture and eight CPUs of the same architecture, the secondary cache 12, and the bus bridge 25 are only connecting to the CPU bus 10. High performance can be delivered, because the external bus 1 is mostly accessed from the CPUs CPU1 through CPU8, but infrequently accessed from the modules coupled to the internal peripheral bus 14. The contents of the primary and secondary caches are coherency controlled by OS1 so as to be consistent and the coherency problem can be coped with optimally. Meanwhile, the OS2 side has the external bus 2 independently of OS1 and, therefore, there is almost no need for coordination for resources with OS1, and high performance can be delivered.

Figure 12:
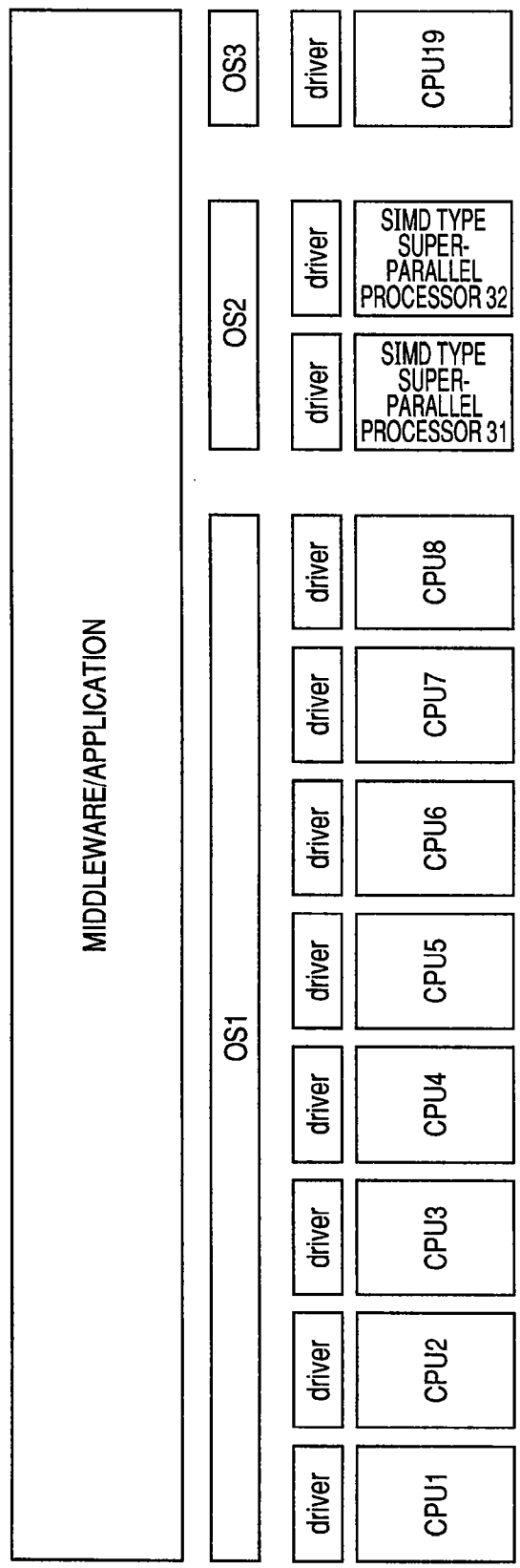
FIG. 12 is a block diagram of software in Embodiment 7 of the invention.

FIG. 12 shows another software structure including an additional OS3 for CPU 12. In addition to the effects described for FIG. 11, this software structure is more efficient, as each OS is dedicated to governing the processors or processor of the same architecture.

What is claimed is:
1. A semiconductor device comprising:
a plurality of processors formed over a single chip and including a plurality of a first type of processors disposed in a first layout region of the single chip in plan view and a plurality of a second type of processors disposed separately from the plurality of the first, type of processors in a second layout region of the single chip in plan view, each said first type of processor having a first architecture, and each said second type of processor having a second architecture which is different from the first architecture of said first type of processor;
a first bus which is disposed in the first layout region of the single chip and to which each of the plurality of the first type of processors is coupled;
a second bus which is disposed in the first layout region of the single chip and to which each of the plurality of the second type of processors is coupled;

a first external bus interface to which the first bus is coupled;

a second external bus interface to which the second bus is coupled;

a plurality of first voltage supply lines arranged along one direction in the first layout region of the single chip in plan view with a space of a first width between adjacent ones of said first voltage supply lines, each said first voltage supply line having a second width in said one direction; and a plurality of second voltage supply lines arranged along said one direction in the second layout region of the single chip in plan view with a space of a third width, which is larger than the first width, between adjacent ones of said second voltage supply lines, each said second voltage supply line having a fourth width, which is smaller than the second width, in said one direction, wherein, in plan view, the first external bus interface is disposed at a first edge of the single chip and the second external bus interface is disposed at a second edge of the single chip different from the first edge, wherein the plurality of the first type of processors and the plurality of the second type of processors are controlled using separate clocks which differ in frequency or phase, wherein the first external bus interface is coupled to a first external bus and the second external bus interface is coupled to a second external bus, wherein the plurality of the first type of processors are configured to access the first external bus via the first bus and the first external bus interface and to access the second external bus via the first bus, the second bus, and the second external bus interface, and wherein the plurality of the second type of processors are configured to access the second external bus via the second bus and the second external bus interface.

2. The semiconductor device according to claim 1, wherein the first layout region is controlled using a high frequency clock, and the second layout region is controlled using a low frequency clock.

3. The semiconductor device according to claim 1, wherein the first layout region is controlled using a high frequency clock and the second layout region is controlled using a low frequency clock, and wherein the first layout region has a larger number of voltage supply terminals than the second layout region.

4. The semiconductor device according to claim 1, further comprising a secondary cache formed over the single chip that couples the first bus and the second bus to each other.

5. The semiconductor device according to claim 4, wherein said secondary cache is located between the first bus and the first external bus interface.

6. The semiconductor device according to claim 1, wherein the first voltage supply lines have a first impedance, and the second voltage supply lines have a second impedance, and wherein the first impedance is lower than the second impedance, and, as between the first and second layout regions, only the first layout region has the first voltage supply lines having the first impedance.

7. A semiconductor device comprising:

a plurality of a first type of processors disposed in a first layout region of a single chip in plan view, the single chip having a rectangular shape with four sides in plan view;

a plurality of a second type of processors disposed separately from the plurality of the first type of processors in a second layout region of the single chip in plan view, each said second type of processor having a different architecture from said first type of processor;

a first bus provided over the single chip, and being disposed in the first layout region of the single chip in plan view and to which the plurality of the first type of processors is coupled;

a second bus provided over the single chip, and being disposed in the second layout region of the single chip in plan view and to which the plurality of the second type of processors is coupled;

a first external bus interface provided over the single chip, to which the first bus is coupled;

a second external bus interface provided over the single chip, to which the second bus is coupled;

a plurality of first voltage supply lines arranged along one direction in the first layout region of the signal chip in plan view with a space of a first width between adjacent ones of said first voltage supply lines, each first voltage supply line having a second width in said one direction; and a plurality of second voltage supply lines arranged along said one direction in the second layout region of the single chip in plan view with a space of a third width, which is larger than the first width, between adjacent ones of said second voltage supply lines, each said second voltage supply line having a fourth width, which is smaller than the second width, in said one direction, wherein, in plan view, the first external bus interface has a portion disposed closer to a first side of the four sides of the single chip than to the other three sides, and the second external bus interface has a portion disposed closer to a second side of the four sides of the single chip than to the other three sides, said second side being a different side from the first side, wherein the plurality of the first type of processors and the plurality of the second type of processors are controlled using separate clocks which differ in frequency or phase, wherein the first external bus interface is coupled to a first external bus and the second external bus interface is coupled to a second external bus, wherein the plurality of the first type of processors are configured to access the first external bus via the first bus and the first external bus interface and to access the second external bus via the first bus, the second bus, and the second external bus interface, and wherein the plurality of the second type of processors are configured to access the second external bus via the second bus and the second external bus interface.

8. The semiconductor device according to claim 7, wherein the plurality of the first type of processors are controlled using a high frequency clock, and the plurality of the second type of processors are controlled using a low frequency clock.

9. The semiconductor device according to claim 7, wherein the first layout region is controlled using a high frequency clock, and the second layout region is controlled using a low frequency clock, and wherein the first layout region has a larger number of voltage supply terminals than the second layout region.

10. The semiconductor device according to claim 7, further comprising a secondary cache provided over the single chip that couples the first bus and the second bus to each other.

11. The semiconductor device according to claim 10, wherein said secondary cache is arranged between the first bus and the first external bus interface.

12. The semiconductor device according to claim 7, wherein said first external bus interface has another portion disposed closer to a third side of said four sides of the single chip than to the other four sides of the single chip in plan view, said third side being a different side from said first and second sides and being adjacent to said first side.

13. The semiconductor device according to claim 7, wherein the first voltage supply lines have a first impedance, and the second voltage supply lines have a second impedance, and wherein the first impedance is lower than the second impedance, and, as between the first and second layout regions, only the first layout region has the first voltage supply lines having the first impedance.

* * * * *